United States Patent [19]

Hsu

[11] Patent Number: 5,963,492

[45] Date of Patent: Oct. 5, 1999

[54] METHOD OF OPERATION FOR SHORTENING BURN-IN TIME

[76] Inventor: Jowsoon Hsu, No. 35-1, Lane 900, Min-Sheng St., Liu-Chia Chun, Kuei-Jen Hsiang, Tainan Hsien, Taiwan

[21] Appl. No.: 09/223,333

[22] Filed: Dec. 30, 1998

[30] Foreign Application Priority Data

Jan. 15, 1998 [TW] Taiwan ................................. 87100471

[51] Int. Cl.$^6$ ...................................................... G11C 7/00

[52] U.S. Cl. ...................... 365/201; 365/200; 365/230.06

[58] Field of Search ................................. 365/200, 201, 365/230.06

[56] References Cited

U.S. PATENT DOCUMENTS 5,831,986  11/1998  Sachden ................................. 365/200

*Primary Examiner*—Vu A. Le
*Attorney, Agent, or Firm*—Jiawei Huang; J. C. Patents

[57] ABSTRACT

A method of operation for shortening burn-in time. An unconnected pin in an address decoder is utilized as a dedicated burn-in pin. Through controlling the number of don't care input pins in the address decoder, the number of word line addresses for a memory that can be checked simultaneously is determined. Because the method of operation in this invention does not require changing any of the existing equipment and tooling, vast quantities of testing time and hence production cost can be saved.

13 Claims, 2 Drawing Sheets

METHOD OF OPERATION FOR SHORTENING BURN-IN TIME

CROSS-REFERENCE TO RELATED APPLICATION

This application claims the priority benefit of Taiwan application serial no. 87100471, filed Jan. 15, 1998, the full disclosure of which is incorporated herein by reference.

BACKGROUND OF THE INVENTION

1. Field of Invention

The present invention relates to burn-in testing. More particularly, the present invention relates to a method of operation for shortening burn-in time.

2. Description of Related Art

To assess the quality of a semiconductor device such as an integrated circuit (IC), burn-in testing is normally carried out after the completion of wafer fabrication. In general, the burn-in testing is conducted after the semiconductor is packaged. During burn-in testing, if one or two lines in the column address, row address or certain bit location have defects, nothing can be done to repair those defective items. Those units either have to be scrapped or have to be sold as an inferior product at a reduced price. Hence, product yield is lowered.

Conventionally, a burn-in testing includes sequentially conducting a single read and a single write operation on a memory cell to detect any errors. However, this mode of burn-in testing is not only time consuming, but also incurs high testing cost.

An example is given with reference to FIG. 1. FIG. 1 is a block diagram showing a conventional address decoder. For a memory chip such as a static random access memory (SRAM) or a dynamic random access memory (DRAM), each of these units comprises an address decoder 10. Furthermore, this address decoder 10 has at least three address input terminals A2, A1 and A0. Table 1 below shows the logic states of various output lines according to the input states for a conventional address decoder. During a burn-in testing, if the input values to terminals (A2,A1,A0) is (0,0,0), the word line address X0 will be selected by the internal circuit of the address decoder 10. In other words, the output from X0 is a logic "1", while the outputs from X1 to X7 are logic "0". With appropriate address selection, functional tests such as the execution of a read and a write operation can be carried out with respect to the word line address X0. Then, when the testing of word line address X0 is over, logic values of (0,0,1) can be input to the input terminals (A2,A1,A0). Again, after passing through the internal circuit of the address decoder 10, the word line address X1 will be selected. In other words, the output from X1 is logic "1", while the outputs from X0 and X2 to X7 are logic "0". With address selected, read and write functional operations can be carried out with respect to the word line address X1. Similarly, when the testing of word line address X1 is over, logic values of (0,1,0) to (1,1,1) can be input to the input terminals (A2,A1,A0) to select the corresponding word line addresses X2 to X7 one after the other. Therefore, read and write operations with respect to these other word line addresses X2 to X7 can then be executed one by one. Obviously, there is no restriction to how the word line addresses are selected for carrying out the burn-in testing. For example, for a three bits input address decoder, as long as read and write operations for all the word line addresses obtained by decoding the inputs from (0,0,0) to (1,1,1) are checked, the burn-in operation is considered adequate. However, finishing these sequences of testing operations require a long time and adds to the cost of production.

TABLE 1

| A2 | A1 | A0 | X7 | X6 | X5 | X4 | X3 | X2 | X1 | X0 |
|----|----|----|----|----|----|----|----|----|----|----|
| 0  | 0  | 0  | 0  | 0  | 0  | 0  | 0  | 0  | 0  | 1  |
| 0  | 0  | 1  | 0  | 0  | 0  | 0  | 0  | 0  | 1  | 0  |
| 0  | 1  | 0  | 0  | 0  | 0  | 0  | 0  | 1  | 0  | 0  |
| 0  | 1  | 1  | 0  | 0  | 0  | 0  | 1  | 0  | 0  | 0  |
| 1  | 0  | 0  | 0  | 0  | 0  | 1  | 0  | 0  | 0  | 0  |
| 1  | 0  | 1  | 0  | 0  | 1  | 0  | 0  | 0  | 0  | 0  |
| 1  | 1  | 0  | 0  | 1  | 0  | 0  | 0  | 0  | 0  | 0  |
| 1  | 1  | 1  | 1  | 0  | 0  | 0  | 0  | 0  | 0  | 0  |

In light of the foregoing, there is a need to shorten the burn-in testing time.

SUMMARY OF THE INVENTION

Accordingly, the present invention is to provide a method of operation for shortening burn-in testing time so that a vast quantity of memory cell testing time can be saved and production cost can be lowered.

In another aspect, this invention is to provide a method of operation for shortening burn-in testing time that does not require changing any of the existing equipment and tooling, hence able to lower production cost considerably.

To achieve these and other advantages and in accordance with the purpose of the invention, as embodied and broadly described herein, the invention provides a method of operation for shortening burn-in testing time. The method utilizes an unconnected pin in the address decoder to act as a dedicated burn-in pin. Then, through controlling the number of don't care pins, the number of word line addresses simultaneously selected in a single burn-in testing operation is determined.

In yet another aspect, the method of operation for shortening the burn-in testing time can be applied to check the functionality of the word line addresses of memory chip address by the word line. The method of operation includes applying a high potential to a dedicated burn-in pin of the memory chip. When the input terminal of a memory chip contains a total of n don't care pins, the remaining input pins can be set to either a high or a low potential in order to simultaneously check the function of $2^n$ word line addresses.

The invention achieves the above-identified objects by providing a method of operation for shortening burn-in time that is particularly suitable for use in a memory chip. The memory chip comprises an address decoder and a memory unit. The address decoder including a dedicated burn-in pin, a first input pin and a second input pin. The memory unit including a first word line address, a second word line address, a third word line address and a fourth word line address. The method of burn-in testing including checking the functional operation of the first word line address, the second word line address, the third word line address and the fourth word line address. In order to carry out the burn-in testing, a high potential is applied to the dedicated burn-in pin, and then choosing either the first input pin and the second input pin as a don't care pin, the other input pin then receiving an input address. Next, the first word line address and the second word line address are simultaneously checked when the input address pin is set to a low potential. Finally, the third word line address and the fourth word line address are simultaneously checked when the input address pin is set to a high potential.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
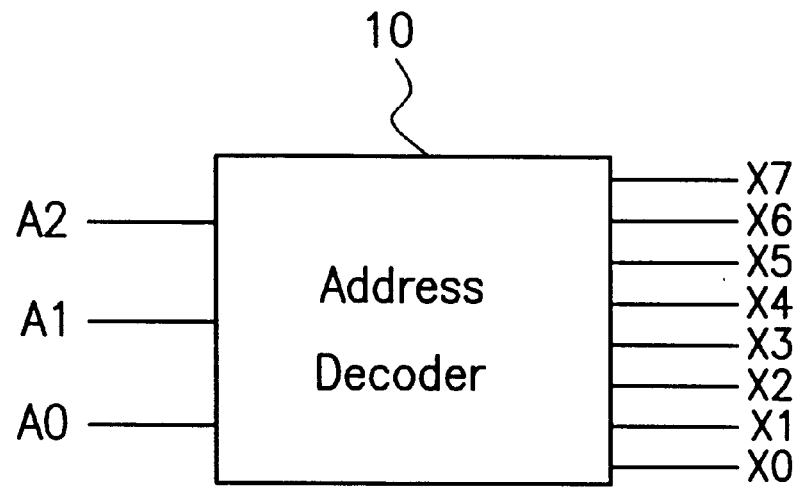
FIG. 1 is a block diagram showing a conventional address decoder.

Reference will now be made in detail to the present preferred embodiments of the invention, examples of which are illustrated in the accompanying drawings. Wherever possible, the same reference numbers are used in the drawings and the description to refer to the same or like parts.

Figure 2:
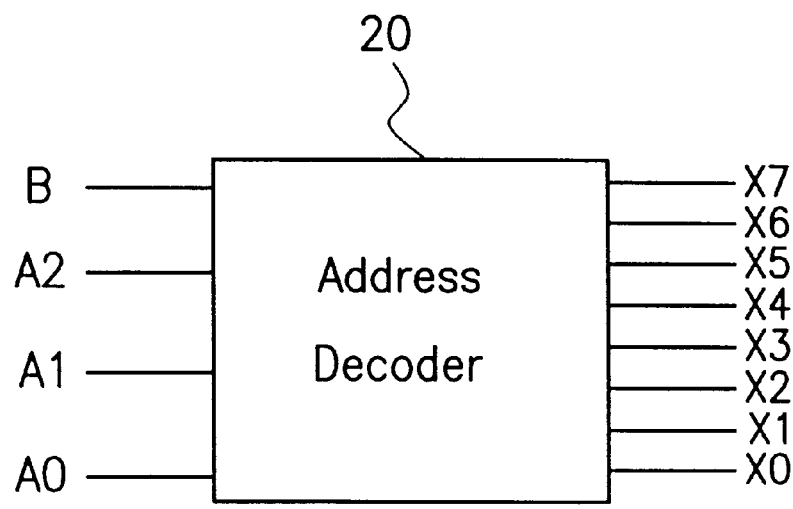
FIG. 2 is a block diagram showing an address decoder according to one preferred embodiment of this invention.

FIG. 2 is a block diagram showing an address decoder according to one preferred embodiment of this invention. For a memory chip such as a static random access memory (SRAM) or a dynamic random access memory (DRAM), each of these chips comprises an address decoder 20 and a memory unit (not shown in the figure). The address decoder 20 includes at least one dedicated burn-in pin B and three address input pins A2, A1 and A0. Table 2 below shows the logic states of various output lines according to the input states for the address decoder 20 of this invention.

TABLE 2

| B | A2 | A1 | A0 | X7 | X6 | X5 | X4 | X3 | X2 | X1 | X0 |
|---|----|----|----|----|----|----|----|----|----|----|----|
| 1 | x  | 0  | 0  | 0  | 0  | 0  | 0  | 0  | 0  | 1  | 1  |
| 1 | x  | 0  | 1  | 0  | 0  | 0  | 0  | 1  | 1  | 0  | 0  |
| 1 | x  | 1  | 0  | 0  | 0  | 1  | 1  | 0  | 0  | 0  | 0  |
| 1 | x  | 1  | 1  | 1  | 1  | 0  | 0  | 0  | 0  | 0  | 0  |

First, as shown in Table 2, an unconnected pin (NC) is selected to serve as a high potential input terminal, wherein a high potential represents an input having a logic value of "1". This unconnected pin (NC) now becomes a dedicated burn-in pin B. One of the input pins A2 is converted to a don't care pin (represented by x in Table 2). Next, a low potential is applied to the address input pins A1 and A0, wherein a low potential represents a logic value of "0". At this point, the logic potential of pins (B,A2,A1, A0) are (1,x,0,0). After decoding within the address decoder 20, word line addresses selected are X0 and X1. In other words, X0=1 and X1=1 while X2 to X7=0. With the selection, read and write operations with respect to the word line addresses X0 and X1 can now be tested. Next, from Table 2, when input values of (1,x,0,1) are applied to respective pins (B,A2,A1,A0), word line addresses decoded out are X2 and X3; similarly, when input values of (1,x,1,0) are applied to respective pins (B,A2,A1,A0), word line addresses decoded out are X4 and X5; and, when input values of (1,x,1,1) are applied to respective pins (B,A2,A1,A0), word line addresses decoded out are X6 and X7.

Obviously, there is no restriction to how the word line addresses are selected for carrying out burn-in testing. As long as all the word line addresses obtained by decoding the inputs are all selected for functional checking, the burn-in operation is considered adequate.

From the above embodiment of this invention, a generalized relationship between the input address and its corresponding word line address is shown by the following formulae of Eq. 1 below:

$$\text{(1)} \quad\quad\quad \text{(2)}$$
$$X0 = B\overline{A1}\ \overline{A0} + \overline{B}\ \overline{A2}\ \overline{A1}\ \overline{A0};$$
$$X1 = B\overline{A1}\ \overline{A0} + \overline{B}\ \overline{A2}\ \overline{A1}\ A0;$$
$$X2 = B\overline{A1}\ A0 + \overline{B}\ \overline{A2}\ A1\ \overline{A0};$$
$$X3 = B\overline{A1}\ A0 + \overline{B}\ \overline{A2}\ A1 A0;$$
$$X4 = BA1\ \overline{A0} + \overline{B}\ A2\ \overline{A1}\ \overline{A0};$$
$$X5 = BA1\ \overline{A0} + \overline{B}\ A2\ \overline{A1}\ A0;$$
$$X6 = BA1 A0 + \overline{B}\ A2 A1\ \overline{A0};$$
$$X7 = BA1 A0 + \overline{B}\ A2 A1 A0;$$

wherein (1) and (2) represent the first part and the second part of Eq. 1 respectively.

The reason for being able to generate two word line addresses simultaneously for functional checking can be explained by the computational logic according to the above formulae of Eq. 1:

(1) $X0 \cdot X1 = B\ \overline{A1}\ \overline{A0}$; therefore, when (B,A2,A1,A0)=(1, x,0,0), word line addresses X0 and X1 are both selected.

(2) $X2 \cdot X3 = B\ \overline{A1}\ A0$; therefore, when (B,A2,A1,A0)=(1, x,0,1), word line addresses X2 and X3 are both selected.

(3) $X4 \cdot X5 = BA1\ \overline{A0}$; therefore, when (B,A2,A1,A0)=(1, x,1,0), word line addresses X4 and X5 are both selected.

(4) $X6 \cdot X7 = BA1 A0$; therefore, when (B,A2,A1,A0)=(1,x, 1,1), word line addresses X6 and X7 are both selected.

In addition, a high potential B is applied to the input address pin B in the first part (1) of formulae Eq 1. On the other hand, a low potential $\overline{B}$ is applied to the input address pin B in the second part (2) of formulae of Eq. 1. The remaining input address pins (A1,A0) in the first part of Eq. 1 are in the order (0,0), (0,0), (0,1), (0,1), (1,0), (1,0), (1,1) and (1,1), respectively. The remaining input address pins (A2,A1,A0) in the second part of Eq. 1 are in the order (0,0,0), (0,0,1), (0,1,0), (0,1,1), (1,0,0), (1,0,1), (1,1,0) and (1,1,1), respectively. From the above, it can be seen that when the input address pins (A1,A0) in the first part of Eq. 1 have logic values (0,0), word line addresses X0 and X1 are both selected. Similarly, when the input address pins (A1, A0) in the first part of Eq. 1 have logic values (0,1), (1,0) and (1,1) respectively, word line address pairs X2 and X3, X4 and X5, X6 and X7 are selected in turn. Furthermore, if we really want to revert back to the conventional burn-in testing mode of checking a single word line address at a time, it can be achieved by not implementing the first part of Eq. 1.

The operating principles demonstrate in the above can be similarly applied to a much larger configuration. For example, the same principles can be applied to an address decoder having a dedicated burn-in pin and a plurality of input pins, wherein the memory unit also includes a plurality of word line addresses. When a high input potential is applied to the dedicated burn-in pin, and the input address pins happen to have n don't care pins, a pattern of high or low potentials can be applied to the remaining input address pins to check a particular set of $2^n$ word line addresses simultaneously, where n represents an integer greater than one. Therefore, when the number of don't care input address pins are set in the design stage, the number of word line addresses that can be checked simultaneously can be two, four, eight and so on up to $2^n$.

Figure 3:
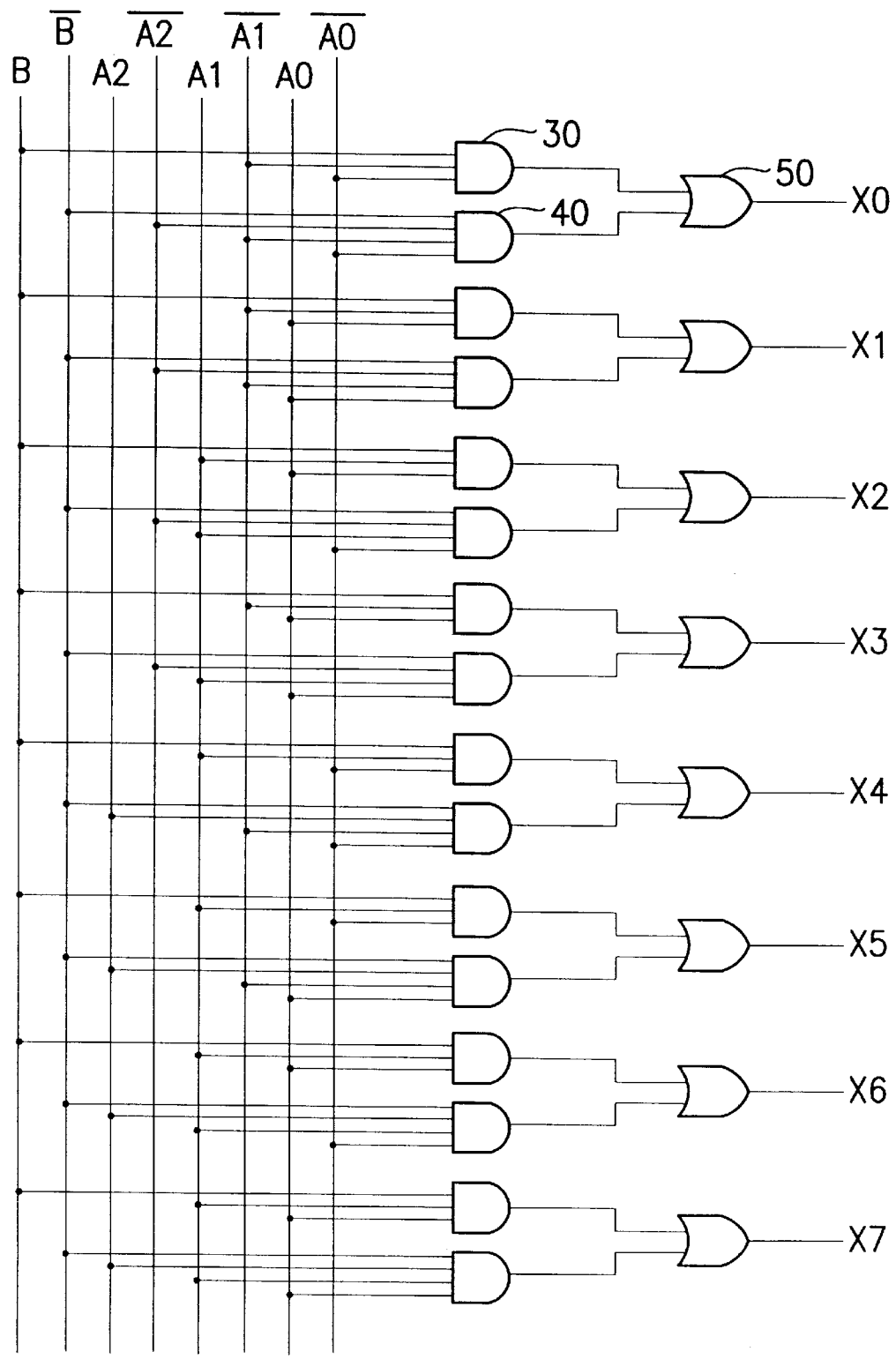
FIG. 3 is an equivalent logic circuit diagram showing the implementation of Eq. 1 according to the embodiment of this invention.

FIG. 3 is an equivalent logic circuit diagram showing the implementation of Eq. 1 according to the embodiment of this invention. According to the method of this invention, the address decoding of word line addresses X0 to X7 can be implemented using 3-input AND gates, 4-input AND gates and 2-input OR gates. Using word line address X0 as an example, if the formula X0=B $\overline{A1}$ $\overline{A0}$+$\overline{B}$ $\overline{A2}$ $\overline{A1}$ $\overline{A0}$ is implemented using a logic circuit, the connections of the AND and OR gates are: the input terminals of a 3-input AND gate 30 are connected to the input address B, and $\overline{A0}$ respectively; the input terminals of a 4-input AND gate 40 are connected to the input address $\overline{B}$, $\overline{A2}$, $\overline{A1}$ and $\overline{A0}$ respectively; the input terminals of a 2-input OR gate 50 are connected to the output terminals of the 3-input NAND gate 30 and the 4-input NAND gate 40 respectively; and the output terminal of the 2-input OR gate 50 outputs a correct word line address X0. Similarly, the connections of logic circuit for generating other word line addresses X1 to X7 are almost replicas of the electric circuit structures given by the example of generating word line address X0 above. In fact, all of them follow the relationship as dictated by Eq. 1.

As a summary, it is obvious from the above description that the preferred embodiment of this invention is able to shorten at least half of the burn-in time. Therefore, considerable production cost can be saved by incorporating this invention in memory design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operation for shortening burn-in time that is particularly suitable for use in a memory chip, wherein the memory chip comprises an address decoder and a memory unit, the address decoder further including a dedicated burn-in pin, a first input pin and a second input pin, the memory unit further including a first word line address, a second word line address, a third word line address and a fourth word line address, the method of burn-in testing including checking the functional operation of the first word line address, the second word line address, the third word line address and the fourth word line address, the method of carrying out the burn-in testing comprising:

applying a high potential to the dedicated burn-in pin, and then choosing either the first input pin and the second input pin as a don't care pin, the other input pin then receiving an input address;

simultaneously checking the first word line address and the second word line address when the input address pin is set to a low potential; and simultaneously checking the third word line address and the fourth word line address when the input address pin is set to a high potential.

2. The method of operation of claim 1, wherein the method of operation further includes applying a high potential to the dedicated burn-in pin, and then setting the first input pin and the second input pin as don't care pins, simultaneously checking the first word line address, the second word line address, the third word line address and the fourth word line address.

3. The method of operation of claim 1, wherein the memory chip includes a static random access memory.

4. The method of operation of claim 1, wherein the memory chip includes a dynamic random access memory.

5. The method of operation of claim 1, wherein a high potential represents a logic value of "1".

6. The method of operation of claim 1, wherein a low potential represents a logic value of "0".

7. The method of operation of claim 1, wherein the functional operation includes reading and writing operations.

8. A method of operation for shortening burn-in time that is particularly suitable for use in a memory chip, wherein the memory chip comprises an address decoder and a memory unit, the address decoder further including a dedicated burn-in pin and a plurality of input pins, the memory unit further including a plurality of word line addresses, the method of burn-in testing including checking the functional operation of the word line addresses, the method of carrying out the burn-in testing comprising:

applying a high potential to the dedicated burn-in pin, wherein if n of the input pins is chosen as don't care pins, then the remaining input pins are set to respective high or low potentials so that a total of $2^n$ word line addresses can be simultaneously checked, where n is an integer greater than one.

9. The method of operation of claim 8, wherein the memory chip includes a static random access memory.

10. The method of operation of claim 8, wherein the memory chip includes a dynamic random access memory.

11. The method of operation of claim 8, wherein a high potential represents a logic value of "1".

12. The method of operation of claim 8, wherein a low potential represents a logic value of "0".

13. The method of operation of claim 8, wherein the functional operation includes reading and writing operations.

* * * * *